US012717510B2

(12) United States Patent
Seo

(10) Patent No.: US 12,717,510 B2
(45) **Date of Patent: *Aug. 25, 2026**

(54) VARIABLE NAND MODE WITH SINGLE PLL SOURCE

(71) Applicant: Micron Technology, Inc., Boise, ID (US)

(72) Inventor: Kang Seok Seo, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/960,407

(22) Filed: Nov. 26, 2024

(65) Prior Publication Data

US 2025/0085889 A1 Mar. 13, 2025

Related U.S. Application Data

(63) Continuation of application No. 17/889,647, filed on Aug. 17, 2022, now Pat. No. 12,204,790.

(51) Int. Cl.

*G06F 3/06* (2006.01)
*G11C 16/04* (2006.01)
*G11C 16/32* (2006.01)

(52) U.S. Cl.

CPC .......... *G06F 3/0655* (2013.01); *G06F 3/0602* (2013.01); *G06F 3/0679* (2013.01); *G11C 16/32* (2013.01); *G11C 16/0483* (2013.01)

(58) Field of Classification Search

CPC .... G06F 3/0655; G06F 3/0602; G06F 3/0679; G11C 16/32; G11C 16/0483

See application file for complete search history.

(56) References Cited

U.S. PATENT DOCUMENTS

| | | | |
|---|---|---|---|
| 5,778,237 | A | 7/1998 | Yamamoto et al. |
| 2012/0159230 | A1 | 6/2012 | Chen |
| 2012/0223749 | A1 | 9/2012 | Sasaki |
| 2013/0021072 | A1 | 1/2013 | Wang et al. |
| 2015/0199822 | A1 | 7/2015 | Tamasi et al. |
| 2019/0278357 | A1 | 9/2019 | Lee et al. |
| 2024/0061607 | A1 | 2/2024 | Seo |

*Primary Examiner* — Jason W Blust

(74) *Attorney, Agent, or Firm* — Schwegman Lundberg & Woessner, P.A.

(57) ABSTRACT

Aspects of the present disclosure configure a memory sub-system controller to select between different PLL frequencies provided by the same PLL to communicate with memory components. The controller configures clock generation circuitry to generate a first clock signal having a first frequency and receives a request to perform one or more hand-shaking operations with a set of memory components. The controller divides the first clock signal to generate a second clock signal having a second frequency that is smaller than the first frequency and communicates with the set of memory components using the second clock signal to perform the one or more hand-shaking operations.

20 Claims, 5 Drawing Sheets

VARIABLE NAND MODE WITH SINGLE PLL SOURCE

PRIORITY APPLICATION

This application is a continuation of U.S. application Ser. No. 17/889,647, Aug. 17, 2022, which is incorporated herein by reference in its entirety.

TECHNICAL FIELD

Embodiments of the disclosure relate generally to memory sub-systems and, more specifically, to providing adaptive media management for memory components, such as memory dies, using a single phase-locked loop (PLL).

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
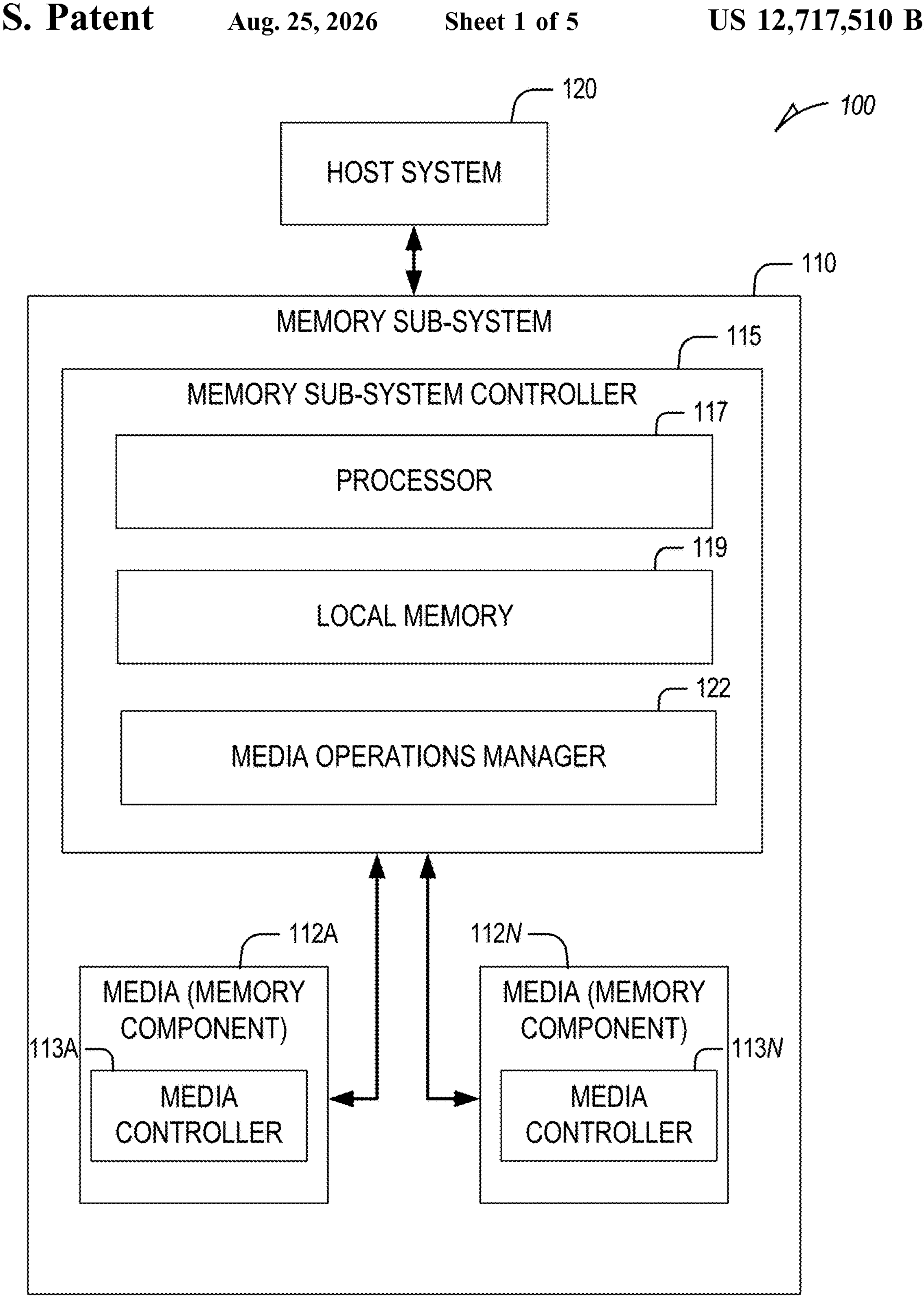
FIG. 1 is a block diagram illustrating an example computing environment including a memory sub-system, in accordance with some embodiments of the present disclosure.

Aspects of the present disclosure configure a system component, such as a memory sub-system controller, to clock selection for performing memory operations. The memory sub-system controller can configure a phase-locked loop (PLL) to generate a high-frequency clock (e.g., a 200 Mhz clock signal). This high-frequency clock can be used to operate on the memory components in high frequency or normal transfer modes. The memory sub-system controller can scale down or divide the high-frequency clock to generate a lower-frequency clock to operate on the memory components during an initialization, hand-shaking, and/or low data transfer mode operations. In this way a single PLL is used to generate two clock signals with different frequencies to operate on the memory components in different data transfer modes. This ensures that performance of the memory system remains optimal by configuring a PLL only once during startup of the memory system rather than multiple times, each configuration of the PLL corresponding to a different data transfer mode. This improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data".

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

There are challenges in efficiently managing or performing media management operations on typical memory devices. Specifically, certain memory devices, such as NAND flash devices, need hand-shaking or a set of initialization operations to be performed at low data transfer rates or a low data transfer mode before the memory devices can be used for normal data transfer operations. To perform such low data transfer mode operations, a PLL needs to be configured to generate a clock signal with the appropriate low frequency. The configuration of the PLL usually takes a great deal of time and resources and introduces delays in performing the initialization operations. Also, after initialization is complete, the PLL needs to be configured again to generate a higher frequency clock signal to allow the firmware and memory to communicate at higher data rates. The configuration of the PLL multiple times for different memory transfer modes is incredibly inefficient and introduces delays. This can result in inefficient, poor, or unreliable memory performance.

Aspects of the present disclosure address the above and other deficiencies by providing a memory controller that can configure the PLL a single time when the memory is started up to generate a high-frequency clock signal. The high-frequency clock signal can correspond to the clock rate needed for operating on the memory during normal data transfer operations. The memory controller then divides down the high-frequency clock signal to generate a lower-frequency clock signal having a low data transfer mode frequency to perform hand-shaking or initialization operations. Once those hand-shaking operations are completed, the original clock signal that is already available from the previously configured PLL is used to operate on the memory in a normal data transfer mode. By not having to re-configure the PLL to generate the higher-frequency clock signal after conducting the hand-shaking or initialization operations with the memory, delays in operating on the memory are reduced. In addition to hand-shaking or initialization operations this method can be used for any operation where low data transfer mode operations may be needed. This increases the efficiency of operating memory systems.

In some examples, the memory controller configures clock generation circuitry to generate a first clock signal having a first frequency and receives a request to perform one or more hand-shaking operations with the set of memory components. The memory controller (before or after receiving the request) divides the first clock signal to generate a second clock signal having a second frequency that is smaller than the first frequency. The memory controller communicates with the set of memory components using the second clock signal to perform the one or more hand-shaking operations. The clock generation circuitry can include a PLL. The first frequency can be at least 200 Mhz and the second frequency can be in the range of 15-24 Mhz.

In some examples, the memory controller detects completion of the one or more hand-shaking operations. The memory controller, in response to detecting completion of the one or more hand-shaking operations, communicates with the set of memory components using the first clock signal.

In some examples, the memory controller receives a request to read or write data to the set of memory components and performs one or more memory operations using the first clock signal to complete the request to read or write data to the set of memory components.

In some examples, the processing device includes a memory interface and the memory interface includes a divider circuit. The divider circuit receives the first clock signal and outputs the second clock signal according to a division factor. The division factor can correspond to a low data transfer mode associated with the set of memory components. The divider circuit can be coupled to a multiplexer that receives the first clock signal and the second clock signal. In such cases, the memory controller controls an output of the multiplexer comprising one of the first and second clock signals based on a select signal generated by the processing device. The select signal can be generated based on a selected data transfer mode of the set of memory components.

In some examples, the system includes a read-only memory (ROM) that includes one or more instructions that are stored and executed by the processing device. The one or more instructions can include firmware instructions.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies).

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans memory components 112A to 112N can correspond to or be grouped as a first block stripe and a single second row that spans memory components 112A to 112N can correspond to or be grouped as a second block stripe. If the single first row includes all good blocks (e.g., each block in the single first row has a reliability grade above a threshold), the first block stripe is a first complete block stripe. If the single first row includes some bad blocks (e.g., one or more blocks in the single first row have a reliability grade below a threshold), the first block stripe is a first short block stripe.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh. The memory sub-system controller 115 can communicate with the memory components 112A to 112N in different data transfer modes using different clock frequencies. For example, during an initialization phase, the memory sub-system controller 115 communicates with the memory components 112A to 112N using a low-frequency clock signal (e.g., a 15-24 Mhz) to perform one or more hand-shaking operations. Then, after the initialization phase successfully completes, the memory sub-system controller 115 communicates with the memory components 112A to 112N using a high-frequency clock signal (e.g., 200 Mhz) to perform one or more memory operations, such as reading/writing user data or host provided information. The different frequency clock signals can be derived from the same PLL circuit by dividing the frequency to a frequency corresponding to the particular data transfer mode.

The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode with instructions for the memory sub-system controller 115 to execute, such as firmware. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other memory management operations, such as wear leveling operations, garbage collection operations, error detection and error-correcting code (ECC) operations, encryption operations, caching operations, memory components 112A to 112N initialization, and/or address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120. The memory sub-system controller 115 can include a memory interface to communicate with the memory components 112A to 112N. Any component included as part of the memory sub-system controller 115 can be included in the memory interface and vice versa.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 can be configured to configure the PLL a single time when the memory components 112A to 112N are started up to generate a high-frequency clock signal. The high-frequency clock signal can correspond to the clock rate needed for operating on the memory components 112A to 112N during normal data transfer operations. The media operations manager 122 then divides down the high-frequency clock signal to generate a lower-frequency clock signal having a low data transfer mode frequency to perform hand-shaking operations with the memory components 112A to 112N. Once those hand-shaking operations are completed, the original clock signal that is already available from the previously configured PLL is used to operate on the memory components 112A to 112N in a normal data transfer mode. By not having to re-configure the PLL to generate the higher-frequency clock signal after conducting the hand-shaking operations with the memory components 112A to 112N, delays in operating on the memory components 112A to 112N are reduced. This increases the efficiency of operating the memory sub-system 110.

Depending on the embodiment, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
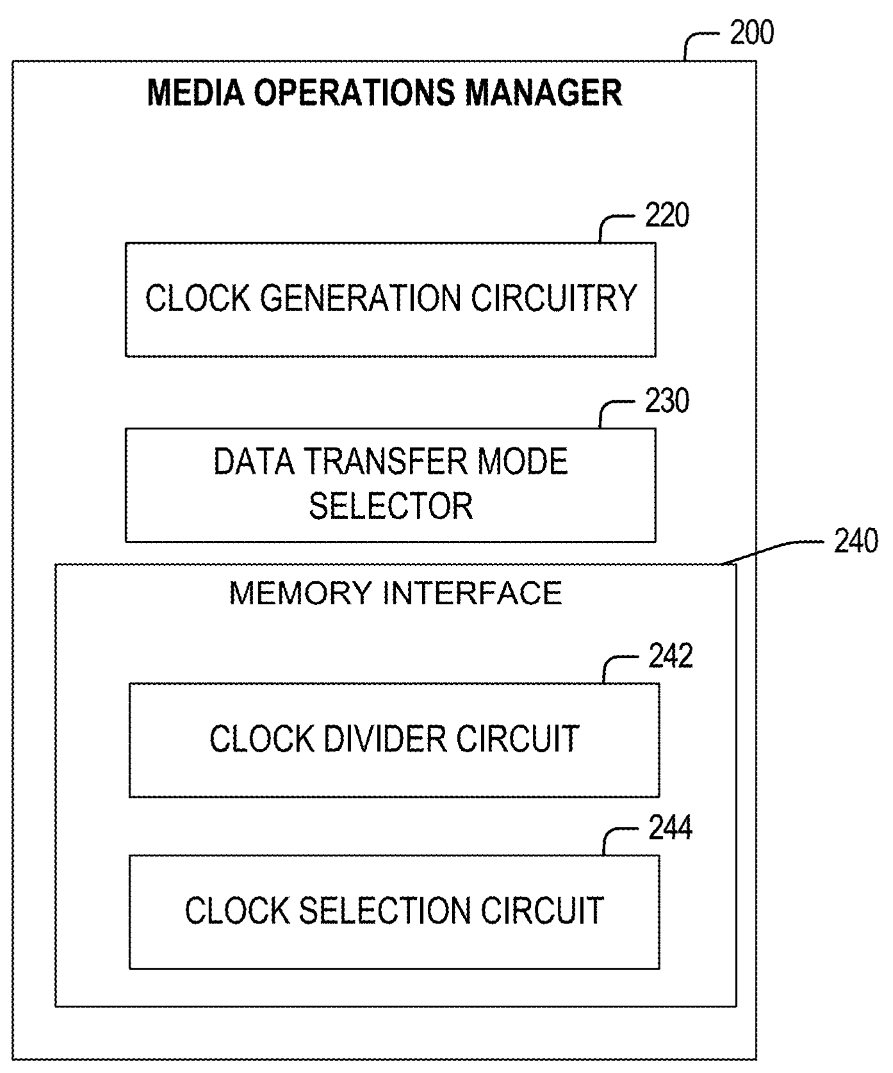
FIG. 2 is a block diagram of an example media operations manager, in accordance with some implementations of the present disclosure.

FIG. 2 is a block diagram of an example media operations manager 200, in accordance with some implementations of the present disclosure. As illustrated, the media operations manager 122 includes clock generation circuitry 220, a data transfer mode selector 230, and/or a memory interface 240 which can include a clock divider circuit 242 and a clock selection circuit 244. For some embodiments, the media operations manager 122 can differ in components or arrangement (e.g., less or more components) from what is illustrated in FIG. 2. Some of the components shown to be included as part of the media operations manager 200 can be included in any other portion or component of the memory sub-system 110 or memory sub-system controller 115.

The clock generation circuitry 220 includes a physical clock generator, such as a PLL. The media operations manager 200 can configure the PLL of the clock generation circuitry 220 when the memory sub-system 110 is powered on. In some cases, the clock generation circuitry 220 reads configuration information associated with the set of memory components 112A to 112N to determine the normal data transfer mode frequency of the set of memory components 112A to 112N. In some examples, this normal data transfer mode represents normal memory operations that can be performed by a host after the set of memory components 112A to 112N are initialized. In an example, the clock frequency used in this normal data transfer mode can be 200 Mhz. This clock frequency is provided to the memory interface 240 and particularly to the clock divider circuit 242 of the memory interface 240.

After the PLL is configured to generate the clock signal with the frequency corresponding to the normal data transfer mode, the data transfer mode selector 230 determines whether initialization operations, such as hand-shaking operations, are needed. In response to determining that the initialization operations need to be performed, the data transfer mode selector 230 generates a request to perform hand-shaking operations with the set of memory components 112A to 112N. In such cases, the set of memory components 112A to 112N can determine that to perform hand-shaking operations, a low data transfer mode is needed. The data transfer mode selector 230 can access configuration information associated with the set of memory components 112A to 112N to determine the clock frequency associated with communicating with the set of memory components 112A to 112N in the low data transfer mode. In an example, this clock frequency can range from 15 Mhz to 24 Mhz.

The data transfer mode selector 230 generates an instruction to the memory interface 240 to operate the set of memory components 112A to 112N using the lower frequency clock signal. In response, the memory interface 240 configures the division or dividing factor of the clock divider circuit 242 based on the frequency of the normal data transfer mode clock signal and the frequency of the low data transfer mode clock signal. For example, the data transfer mode selector 230 can determine that the low data transfer mode clock signal corresponds to ¼ of the frequency of the normal data transfer mode clock signal. In such cases, the data transfer mode selector 230 configures the clock divider circuit 242 to divide the clock signal with the frequency corresponding to the normal data transfer mode received from the PLL by a factor of four.

The memory interface 240 provides both the divided down clock signal having the frequency corresponding to the low data transfer mode of the set of memory components 112A to 112N and the clock signal having the frequency corresponding to the normal data transfer mode of the set of memory components 112A to 112N to the clock selection circuit 244. In an example, the clock selection circuit 244 includes a multiplexer, such as a clock multiplexer, which outputs a single signal based on a select control signal. For example, the multiplexer can output a first clock signal corresponding to the PLL clock signal having the normal data transfer mode frequency in response to a first value of the select control signal. The multiplexer can output a second clock signal corresponding to a divided version of the PLL clock signal having the low data transfer mode frequency in response to a second value of the select control signal.

The memory interface 240 receives a request from the data transfer mode selector 230 to communicate or send commands to the set of memory components 112A to 112N using a low data transfer mode clock signal. In response, the memory interface 240 switches the select control signal of the clock selection circuit 244 to cause the second clock signal having the divided version of the PLL clock signal to be output. One or more hand-shaking operations are performed by the media operations manager 200 using the selected clock signal, such as the 15-24 Mhz clock signal that is derived from or divided from the previously configured PLL clock signal.

In some examples, the data transfer mode selector 230 can receive an indication from the set of memory components 112A to 112N indicating that the hand-shaking operations have been completed. In response, the data transfer mode selector 230 generates a request or instruction to the memory interface 240 to communicate with the set of memory components 112A to 112N using a normal or high data transfer mode clock signal. In response, the memory interface 240 switches the select control signal of the clock selection circuit 244 to cause the first clock signal having the original version (non-divided version) of the PLL clock signal to be output. One or more memory operations, such as read/write operations of commands received from a host, are performed by the media operations manager 200 using the selected clock signal, such as the 200 Mhz clock signal that corresponds to the previously configured PLL clock signal. In this way, the PLL needs to only be configured once during startup, and the same PLL clock signal can be used to communicate with and operate the set of memory components 112A to 112N using different clock frequencies.

Figure 3:
FIGS. 3 and 4 are flow diagrams of example methods to perform clock selection for performing memory operations, in accordance with some implementations of the present disclosure.
Figure 3:
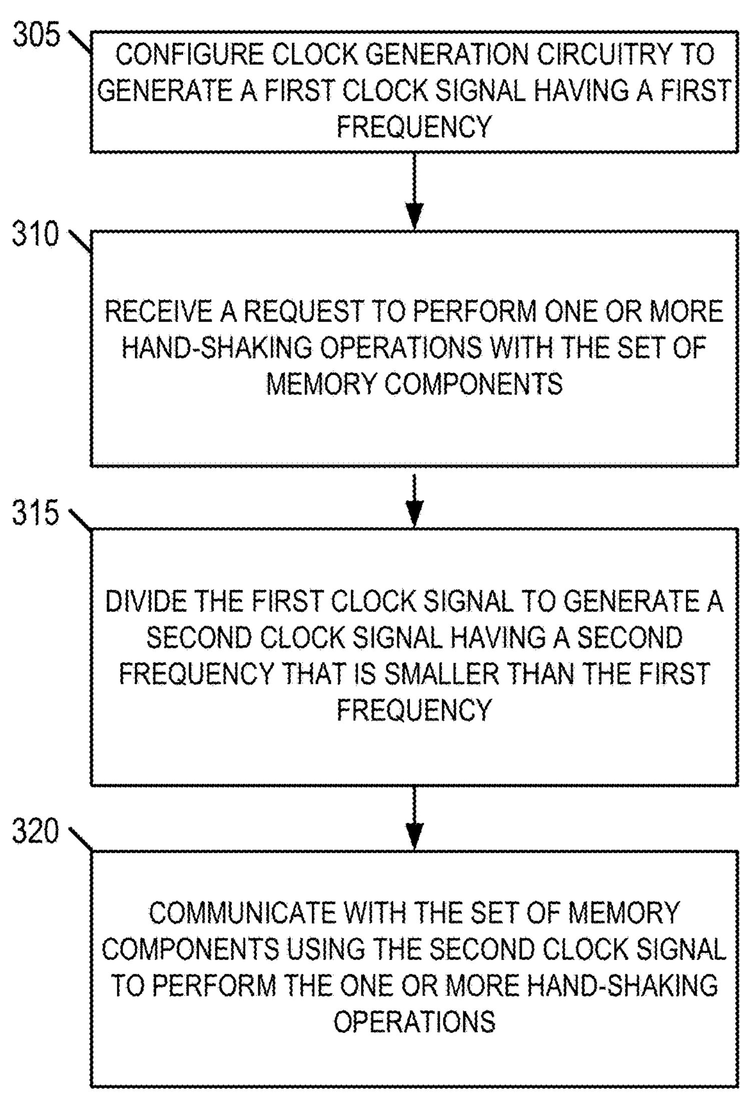

FIG. 3 is a flow diagram of an example method 300 to perform clock selection for performing memory operations, in accordance with some implementations of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the media operations manager 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now FIG. 3, the method (or process) 300 begins at operation 305, with a media operations manager 122 of a memory sub-system (e.g., memory sub-system 110) configuring clock generation circuitry to generate a first clock signal having a first frequency. Then, at operation 310, the media operations manager 122 of a memory sub-system (e.g., memory sub-system 110) receives a request to perform one or more hand-shaking operations with the set of memory components 112A to 112N. The media operations manager 122 of a memory sub-system (e.g., memory sub-system 110), at operation 315, divides the first clock signal to generate a second clock signal having a second frequency that is smaller or lower than the first frequency. Thereafter, at operation 320, the media operations manager 122 of a memory sub-system (e.g., memory sub-system 110) communicates with the set of memory components using the second clock signal to perform the one or more hand-shaking operations.

Figure 4:
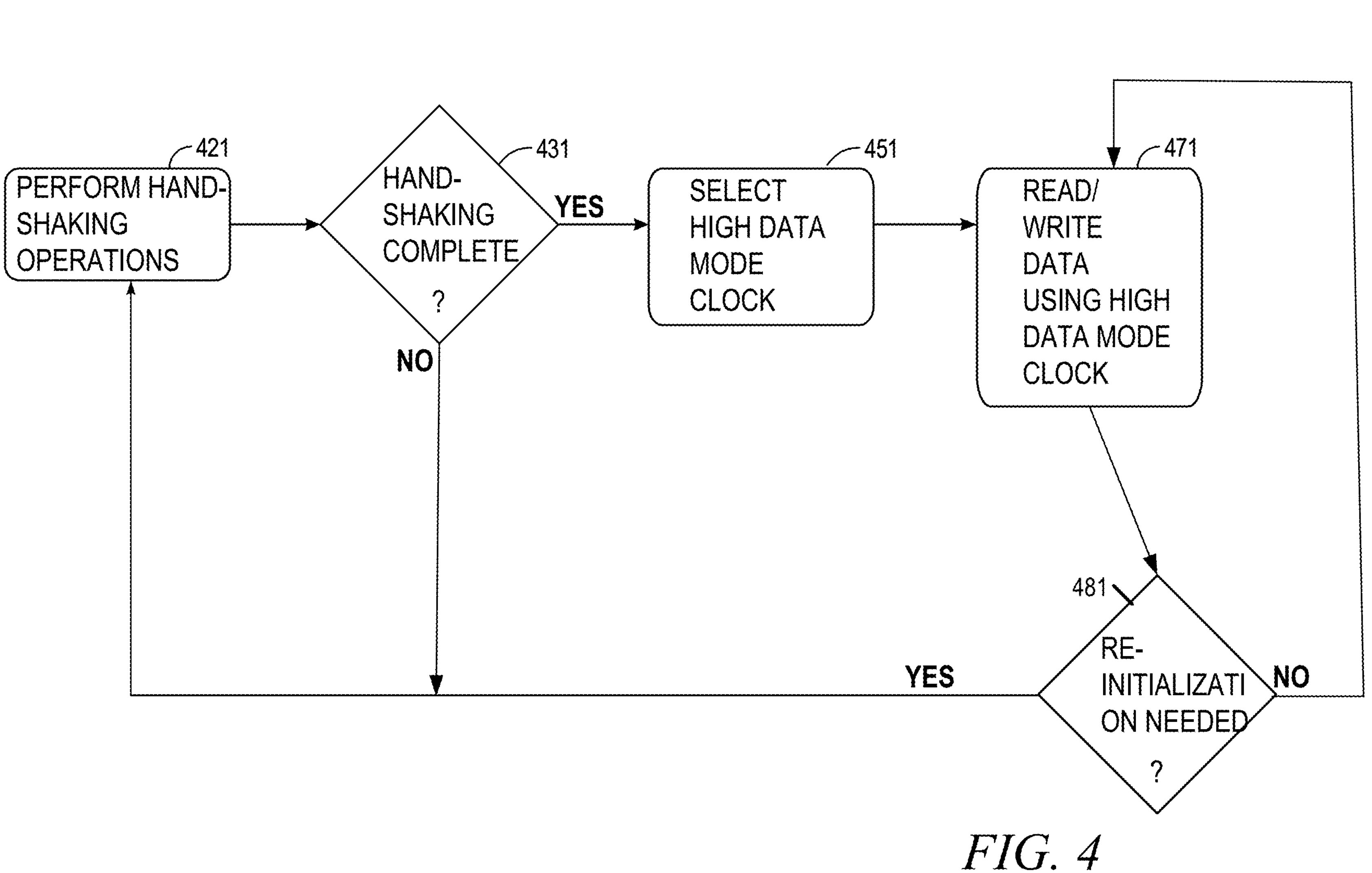

FIG. 4 is a flow diagram of an example method 400 to perform clock selection for performing memory operations, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the media operations manager 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now FIG. 4, the method (or process) 400 begins at operation 421, with a media operations manager 122 of a memory sub-system (e.g., memory sub-system 110) performing hand-shaking operations with the set of memory components 112A to 112N. The hand-shaking operations can be performed using the clock signal generated by dividing the PLL clock signal down to the clock frequency needed for performing memory initialization and hand-shaking operations. Then, at operation 431, the media operations manager 122 of a memory sub-system (e.g., memory sub-system 110) determines whether the hand-shaking operations have been completed. If not, the media operations manager 122 of a memory sub-system (e.g., memory sub-system 110) returns to operation 421. In response to determining that the hand-shaking operations have been completed, the media operations manager 122 of a memory sub-system (e.g., memory sub-system 110) performs operation 451 in which a high data mode clock signal is selected. In this case, the media operations manager 122 of a memory sub-system (e.g., memory sub-system 110) switches a select input of a clock multiplexer to select a high-frequency clock signal for output for use in communicating with the set of memory components 112A to 112N. The media operations manager 122 of a memory sub-system (e.g., memory sub-system 110), at operation 471, reads/writes data using the high data mode clock and at operation 481 determines whether re-initialization of the set of memory components 112A to 112N is needed. If not, the media operations manager 122 of a memory sub-system (e.g., memory sub-system 110) continues to perform operation 471 to execute memory requests received from a host. In response to determining that re-initialization of the set of memory components 112A to 112N is needed, the media operations manager 122 of a memory sub-system (e.g., memory sub-system 110) returns to operation 421 after switching the select input of the clock multiplexer to select the low-frequency clock signal for output.

In view of the disclosure above, various examples are set forth below. It should be noted that one or more features of an example, taken in isolation or combination, should be considered within the disclosure of this application.

Example 1: a system comprising: a set of memory components of a memory sub-system; and a processing device operatively coupled to the set of memory components, the processing device being configured to perform operations comprising: configuring clock generation circuitry to generate a first clock signal having a first frequency; receiving a request to perform one or more hand-shaking operations with the set of memory components; dividing the first clock signal to generate a second clock signal having a second frequency that is smaller than the first frequency; and communicating with the set of memory components using the second clock signal to perform the one or more hand-shaking operations.

Example 2: the system of Example 1 wherein the operations comprise: detecting completion of the one or more hand-shaking operations; and in response to detecting completion of the one or more hand-shaking operations, communicating with the set of memory components using the first clock signal.

Example 3: the system of Examples 1 or 2, wherein the operations comprise: receiving a request to read or write data to the set of memory components; and performing one or more memory operations using the first clock signal to complete the request to read or write data to the set of memory components.

Example 4: the system of any one of Examples 1-3, wherein the clock generation circuitry comprises PLL.

Example 5: the system of any one of Examples 1-4, wherein the processing device comprises a memory interface, the memory interface comprising a divider circuit.

Example 6: the system of Example 5, wherein the divider circuit receives the first clock signal and outputs the second clock signal according to a division factor.

Example 7: the system of Example 6, wherein the division factor corresponds to a low data transfer mode associated with the set of memory components.

Example 8: the system of Example 6, wherein the divider circuit is coupled to a multiplexer that receives the first clock signal and the second clock signal, and wherein the operations comprise: controlling an output of the multiplexer comprising one of the first and second clock signals based on a select signal generated by the processing device.

Example 9: the system of Example 8, wherein the select signal is generated based on a selected data transfer mode of the set of memory components.

Example 10: the system of any one of Examples 1-9, wherein the system comprises a read-only memory (ROM) that includes one or more instructions that are stored and executed by the processing device.

Example 11: the system of Example 10, wherein the one or more instructions comprise firmware instructions.

Example 12: the system of any one of Examples 1-11, wherein the first frequency comprises 200 Mhz.

Methods and computer-readable storage medium with instructions for performing any one of the above Examples.

Figure 5:
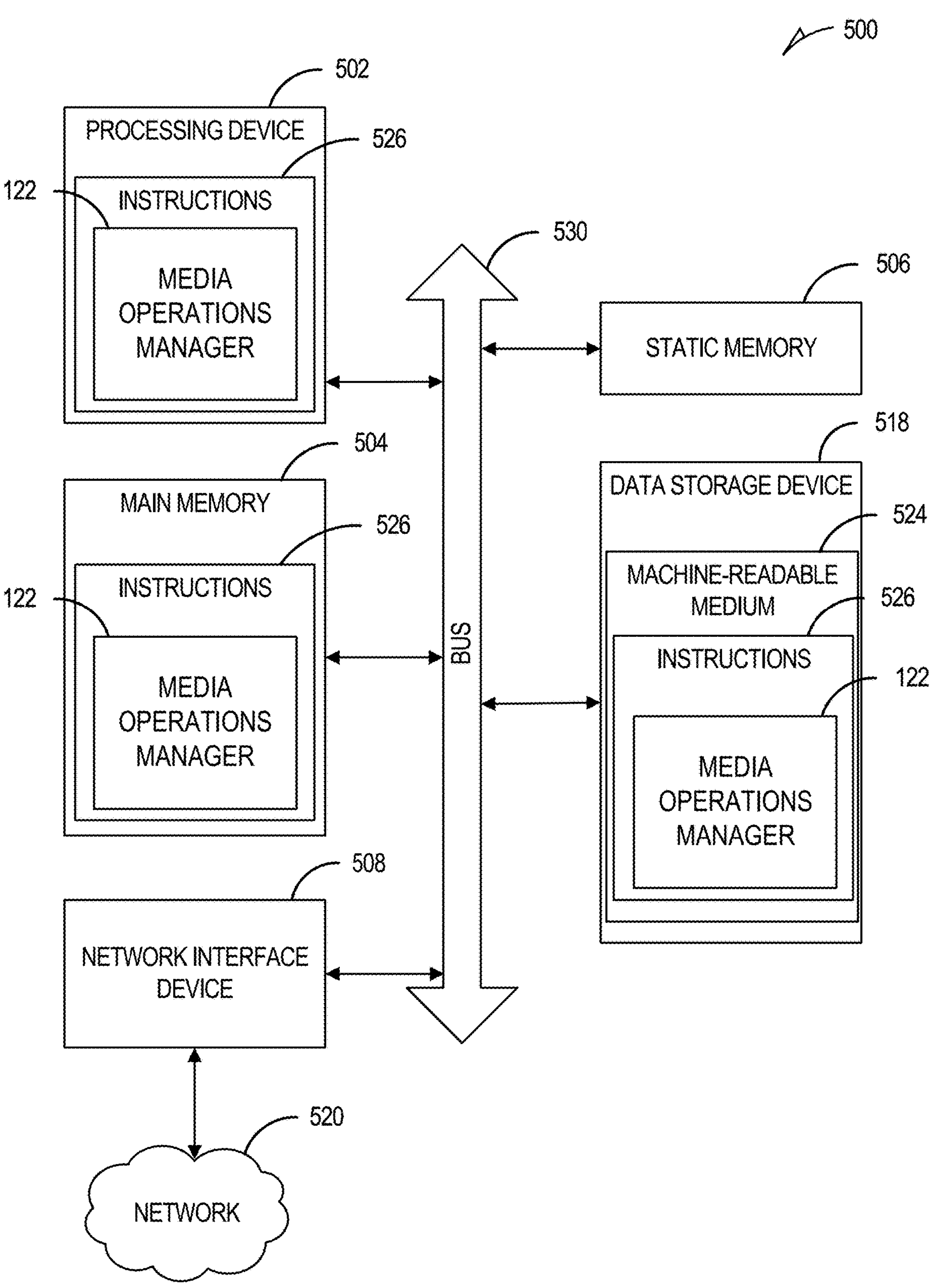
FIG. 5 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 implement functionality corresponding to the media operations manager 122 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a set of memory components of a memory sub-system; and a processing device operatively coupled to the set of memory components, the processing device programmed to perform operations comprising:

communicating with the set of memory components using a second clock signal having a lower frequency than a first clock signal to perform one or more hand-shaking operations in a lower data transfer mode than a data transfer mode associated with the first clock signal; and in response to detecting completion of the one or more hand-shaking operations, transitioning to communicating with the set of memory components using the first clock signal instead of the second clock signal.

2. The system of claim 1, the operations comprising:

configuring clock generation circuitry to generate the first clock signal having a first frequency; and receiving a request to perform one or more hand-shaking operations with the set of memory components.

3. The system of claim 2, the operations comprising:

configuring the clock generation circuitry based on a division factor to divide the first clock signal to generate the second clock signal.

4. The system of claim 1, the operations comprising:

accessing configuration information associated with the set of memory components to determine a clock frequency associated with the lower data transfer mode of the set of memory components; and based on the configuration information, determining a division factor between a normal transfer mode of the set of memory components and the lower data transfer mode.

5. The system of claim 4, wherein the operations comprise:

receiving a request to read or write data to the set of memory components; and performing one or more memory operations using the first clock signal to complete the request to read or write data to the set of memory components.

6. The system of claim 1, wherein the processing device comprises a memory interface, the memory interface comprising a divider circuit.

7. The system of claim 6, wherein the divider circuit receives the first clock signal and outputs the second clock signal according to a division factor.

8. The system of claim 6, wherein a division factor of the divider circuit corresponds to ¼ of a normal transfer mode.

9. The system of claim 8, wherein the divider circuit is coupled to a multiplexer that receives the first clock signal and the second clock signal, and wherein the operations comprise:

controlling an output of the multiplexer comprising one of the first and the second clock signals based on a select signal generated by the processing device.

10. The system of claim 1, wherein the system comprises a read-only memory (ROM) that includes one or more instructions that are stored and executed by the processing device.

11. The system of claim 10, wherein the one or more instructions comprise firmware instructions.

12. A method comprising:

communicating with a set of memory components using a second clock signal having a lower frequency than a first clock signal to perform one or more hand-shaking operations in a lower data transfer mode than a data transfer mode associated with the first clock signal; and in response to detecting completion of the one or more hand-shaking operations, transitioning to communicating with the set of memory components using the first clock signal instead of the second clock signal.

13. The method of claim 12, further comprising:

configuring clock generation circuitry to generate the first clock signal having a first frequency; and receiving a request to perform one or more hand-shaking operations with the set of memory components.

14. The method of claim 13, further comprising:

configuring the clock generation circuitry based on a division factor to divide the first clock signal to generate the second clock signal.

15. The method of claim 13, further comprising:

accessing configuration information associated with the set of memory components to determine a clock frequency associated with the lower data transfer mode of the set of memory components; and based on the configuration information, determining a division factor between a normal transfer mode of the set of memory components and the lower data transfer mode.

16. The method of claim 15, further comprising:

receiving a request to read or write data to the set of memory components; and performing one or more memory operations using the first clock signal to complete the request to read or write data to the set of memory components.

17. A non-transitory computer-readable storage medium comprising instructions that, when executed by a processing device, cause the processing device to perform operations comprising:

communicating with a set of memory components using a second clock signal having a lower frequency than a first clock signal to perform one or more hand-shaking operations in a lower data transfer mode than a data transfer mode associated with the first clock signal; and in response to detecting completion of the one or more hand-shaking operations, transitioning to communicating with the set of memory components using the first clock signal instead of the second clock signal.

18. The non-transitory computer-readable storage medium of claim 17, the operations comprising:

configuring clock generation circuitry to generate the first clock signal having a first frequency; and receiving a request to perform one or more hand-shaking operations with the set of memory components.

19. The non-transitory computer-readable storage medium of claim 18, the operations comprising:

configuring the clock generation circuitry based on a division factor to divide the first clock signal to generate the second clock signal.

20. The non-transitory computer-readable storage medium of claim 17, the operations comprising:

accessing configuration information associated with the set of memory components to determine a clock frequency associated with the lower data transfer mode of the set of memory components; and based on the configuration information, determining a division factor between a normal transfer mode of the set of memory components and the lower data transfer mode.

* * * * *